(12) United States Patent
Wrench et al.

(10) Patent No.: US 11,476,267 B2
(45) Date of Patent: Oct. 18, 2022

(54) LINER FOR V-NAND WORD LINE STACK

(71) Applicant: Applied Materials, Inc., Santa Clara, CA (US)

(72) Inventors: Jacqueline S. Wrench, San Jose, CA (US); Yixiong Yang, Fremont, CA (US); Yong Wu, Sunnyvale, CA (US); Wei V. Tang, Santa Clara, CA (US); Srinivas Gandikota, Santa Clara, CA (US); Yongjing Lin, San Jose, CA (US); Karla M Bernal Ramos, San Jose, CA (US); Shih Chung Chen, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 170 days.

(21) Appl. No.: 16/876,280

(22) Filed: May 18, 2020

(65) Prior Publication Data
US 2020/0373318 A1 Nov. 26, 2020

Related U.S. Application Data

(60) Provisional application No. 62/852,396, filed on May 24, 2019.

(51) Int. Cl.
| | | |
|---|---|---|
| *H01L 21/285* | (2006.01) |
| *H01L 21/28* | (2006.01) |
| *H01L 21/311* | (2006.01) |
| *H01L 27/11556* | (2017.01) |
| *H01L 21/67* | (2006.01) |

(Continued)

(52) U.S. Cl.
CPC ........ *H01L 27/11556* (2013.01); *C23C 16/06* (2013.01); *C23C 16/45525* (2013.01); *C23C 16/50* (2013.01); *H01L 21/28568* (2013.01); *H01L 21/31116* (2013.01); *H01L 21/67167* (2013.01); *H01L 21/67207* (2013.01); *H01L 29/40114* (2019.08); *H01L 29/42324* (2013.01)

(58) Field of Classification Search
CPC ...................... H01L 27/1157; H01L 27/11524
See application file for complete search history.

(56) References Cited

U.S. PATENT DOCUMENTS

| | | |
|---|---|---|
| 9,978,685 B2 | 5/2018 | Chen et al. |
| 2004/0241988 A1 | 12/2004 | Kang et al. |

(Continued)

FOREIGN PATENT DOCUMENTS

| | | |
|---|---|---|
| KR | 100780689 B1 | 11/2007 |
| KR | 20130124289 A | 11/2013 |

OTHER PUBLICATIONS

PCT International Search Report and Written Opinion in PCT/US2020/033624 dated Aug. 25, 2020, 11 pages.
English Machine Translation of KR100780689B1.

*Primary Examiner* — Xiaoming Liu
(74) *Attorney, Agent, or Firm* — Servilla Whitney LLC

(57) ABSTRACT

Methods of forming memory structures are discussed. Specifically, methods of forming 3D NAND devices are discussed. Some embodiments form memory structures with a metal nitride barrier layer, an α-tungsten layer, and a bulk metal material. The barrier layer comprises a TiXN or TaXN material, where X comprises a metal selected from one or more of aluminum (Al), silicon (Si), tungsten (W), lanthanum (La), yttrium (Yt), strontium (Sr), or magnesium (Mg).

8 Claims, 8 Drawing Sheets

(51) Int. Cl.
  *C23C 16/06* (2006.01)
  *C23C 16/50* (2006.01)
  *C23C 16/455* (2006.01)
  *H01L 29/423* (2006.01)

(56) References Cited

U.S. PATENT DOCUMENTS

| | | |
|---|---|---|
| 2008/0194106 A1* | 8/2008 | Oh .................. C23C 16/34 |
| | | 257/E21.021 |
| 2014/0154883 A1 | 6/2014 | Humayun et al. |
| 2014/0334230 A1 | 11/2014 | Kwon |
| 2016/0020142 A1* | 1/2016 | Chen ................ H01L 21/76877 |
| | | 438/654 |
| 2018/0247821 A1 | 8/2018 | Chen et al. |
| 2019/0279932 A1* | 9/2019 | Wakatsuki ........ H01L 21/28562 |

* cited by examiner

LINER FOR V-NAND WORD LINE STACK

CROSS-REFERENCE TO RELATED APPLICATIONS

This application claims priority to U.S. Provisional Application No. 62/852,396, filed May 24, 2019, the entire disclosure of which is hereby incorporated by reference herein.

TECHNICAL FIELD

Embodiments of the present disclosure pertain to the field of electronic devices and methods and apparatus for manufacturing electronic devices. More particularly, embodiments of the disclosure provide vertical NAND memory devices having metal nitride films and an α-tungsten layer in a stack.

BACKGROUND

Semiconductor technology has advanced at a rapid pace and device dimensions have shrunk with advancing technology to provide faster processing and storage per unit space. As semiconductor technology advances, the market demands increasing smaller chips with increasingly more structures per unit area. One class of devices which has seen many advances in miniaturization are memory devices. As the demand for higher density increases, the typical approach in 3D NAND devices has been to stack more layers. Yet additional layers result in thicker stacks which are increasingly difficult to etch due to increasing aspect ratios.

Currently, titanium nitride (TiN) is used as a liner in 3D NAND devices. In order to maintain F-barrier performance, however, the titanium nitride liner needs to be at least 25 Å in thickness. Such a thick liner reduces the space available for tungsten fill as memory structures become more dense and complex, adversely affecting the stack resistivity.

Therefore, there is a need for reducing stack resistivity while providing good barrier performance.

SUMMARY

Embodiments of the disclosure are directed to a memory structure comprising: a plurality of alternating layers of a silicon material and a metal gate, the metal gate comprising a conformal barrier layer, a conformal α-tungsten (W) layer, and a bulk tungsten layer; and a memory hole channel formed through the plurality of alternating layers and having a conformal layer of a poly-silicon material deposited on a first surface, a second surface, a third surface of the memory hole channel.

Embodiments of the disclosure are directed to a method of forming a memory structure. In one or more embodiments, a method of forming a memory structure comprises depositing a plurality of alternating layers of a nitride material and an oxide material; etching a memory hole through the plurality of alternating layers to form a first exposed surface and a second exposed surface of the alternating layers, the memory hole having a width; depositing a conformal layer of poly-silicon into the memory hole; removing the nitride material to form an opening and expose the oxide material; conformally depositing a high-K layer in the opening; conformally depositing a barrier layer in the opening on the high-K layer, the barrier layer comprising TiXN or TaXN; conformally depositing an α-tungsten (W) layer on the barrier layer; depositing a metal material on the α-tungsten (W) layer; and optionally, planarizing the memory structure.

In one or more embodiments, a processing tool comprises a central transfer station comprising a robot configured to move a wafer; a plurality of process stations, each process station connected to the central transfer station and providing a processing region separated from processing regions of adjacent process stations, the plurality of process stations comprising a barrier layer deposition chamber and an α-tungsten (W) deposition chamber; and a controller connected to the central transfer station and the plurality of process stations, the controller configured to activate the robot to move the wafer between process stations, and to control a process occurring in each of the process stations.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
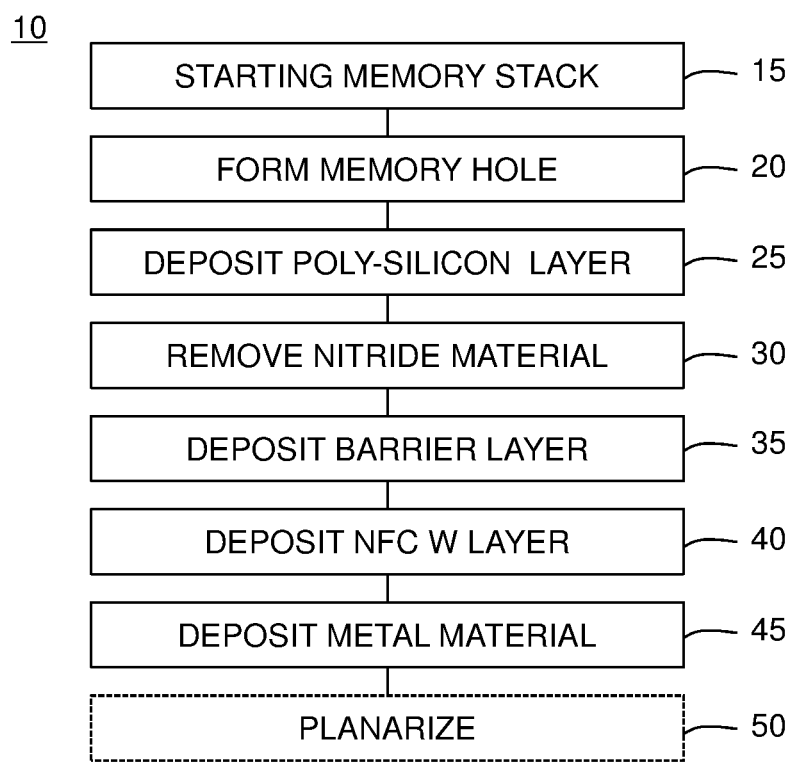
FIG. 1 depicts a process flow diagram of a method of manufacturing an memory device according to one or more embodiments described herein.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the terms "precursor", "reactant", "reactive gas" and the like are used interchangeably to refer to any gaseous species that can react with the substrate surface.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

One or more embodiments advantageously provide a thin metal nitride film, which serves as a barrier layer/liner in memory structures. The barrier layer comprises TiXN and provides improved F barrier performance when compared to a TiN liner in a VNAND memory structure. Additionally, the TiXN barrier layer of one or more embodiments has a thickness that is less than a standard TiN liner, while reducing stack resistivity.

As used herein, the term "3D NAND" refers to a type of electronic (solid-state) non-volatile computer storage memory in which the memory cells are stacked in multiple layers. 3D NAND memory generally includes a plurality of memory cells that include floating-gate transistors. Traditionally, 3D NAND memory cells include a plurality of NAND memory structures arranged in three dimensions around a bit line.

The disclosure herein utilizes terms such as "vertical", "horizontal", "lateral" and the like. As used herein, "vertical" refers to the plane which extends from close to the substrate to a point or plane distant from the substrate. As illustrated in the attached figures, the vertical plane runs from the top of the 3D NAND device (top of the page) to the substrate (bottom of the page). Similarly, "horizontal" refers to the plane which extends from one side of the substrate to the other. As illustrated in the attached figures, the horizontal plane runs from the left of the 3D NAND device (left of the page) to the right of the 3D NAND device (right of the page). Accordingly, "lateral" should be understood as moving from left to right or vice versa, i.e. horizontally. The skilled artisan will recognize that the directional descriptions are relative to the orientation of the 3D NAND device and are not limited to any particular substrate orientation.

As used in this specification and the appended claims, the term "selectively" refers to process which acts on a first surface with a greater effect than another second surface. Such a process would be described as acting "selectively" on the first surface over the second surface. The term "over" used in this regard does not imply a physical orientation of one surface on top of another surface, rather a relationship of the thermodynamic or kinetic properties of the chemical reaction with one surface relative to the other surface. For example, selectively depositing a cobalt film onto a copper surface over a dielectric surface means that the cobalt film deposits on the copper surface and less or no cobalt film deposits on the dielectric surface; or that the formation of the cobalt film on the copper surface is thermodynamically or kinetically favorable relative to the formation of a cobalt film on the dielectric surface.

Referring to the Figures, some embodiments of the disclosure relate to methods for forming memory structures or memory devices, for example 3D NAND devices. FIG. 1 illustrates a process flow diagram of a method of manufacturing a memory device according to one or more embodiments. The skilled artisan will recognize that the method 10 can include any or all of the processes illustrated. Additionally, the order of the individual processes can be varied for some portions. The method 10 can start at any of the enumerated processes without deviating from the disclosure. In one or more embodiments, the method 10 of manufacturing a memory structure begins at operation 15 were a plurality of alternating layers of a nitride material and an oxide material are deposited to form a starting memory stack. At operation 20, a memory hole is formed through the plurality of alternating layers. At operation 25, a layer of poly-silicon is deposited into the memory hole. At operation 30, the nitride material is removed. At operation 35, a barrier layer is deposited. At operation 40, an α-tungsten (W) layer is deposited. At operation 45, a metal material is deposited on the α-tungsten (W) layer. At operation 50, the memory structure is optionally planarized.

Figure 2:
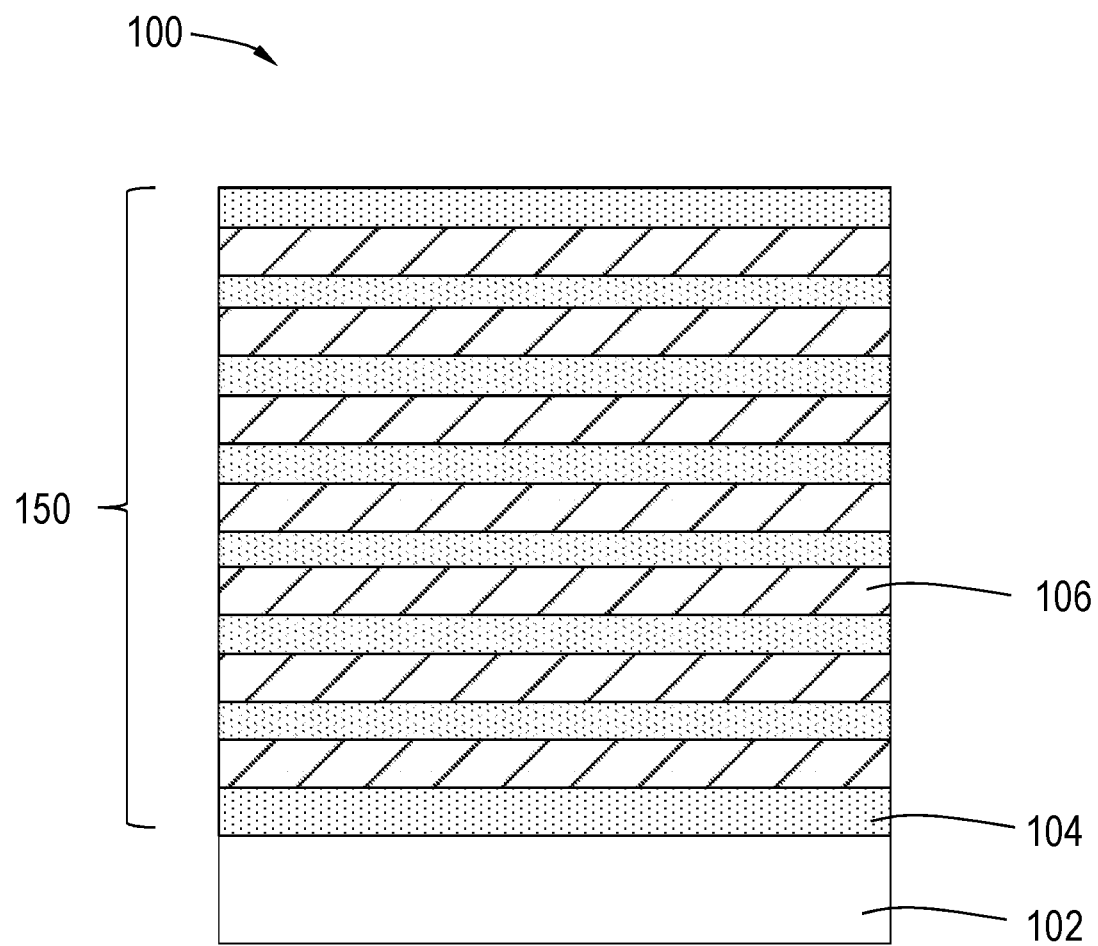
FIG. 2 illustrates a cross-sectional view of a memory device according to one or more embodiments described herein.

FIG. 2 illustrates a cross-sectional view of an exemplary memory structure 100 according to some embodiments of this disclosure. In one or more embodiments, a plurality of alternating layers 150 of a nitride material 106 and an oxide material 104 are deposited on a substrate 102.

In one or more embodiments, the nitride material 106 comprises silicon nitride. In one or more embodiments, the oxide material 104 comprises silicon oxide. In one or more embodiments, the oxide material 104 consists essentially of silicon. As will be understood by one skilled in the art, each of the nitride material 106 and the oxide material 104 may be stoichiometric or non-stoichiometric materials. For example, the terms "silicon oxide" and "silicon dioxide" may both be used to describe a material having silicon and oxygen atoms in any suitable stoichiometric ratio. The same is true for the other materials listed in this disclosure, e.g. silicon nitride, silicon oxynitride, tungsten oxide, zirconium oxide, aluminum oxide, hafnium oxide, and the like.

The alternating layers 150, including the nitride material 106 and the oxide material 104, may be deposited by any suitable process known to the skilled artisan, including, but not limited to, atomic layer deposition, physical vapor deposition, or chemical vapor deposition. In one or more embodiments, each of the nitride material 106 and the oxide material 104 are deposited by chemical vapor deposition.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A, e.g. aluminum precursor) is pulsed into the reaction zone followed by a first time delay. Next, a second precursor or compound B (e.g. oxidant) is pulsed into the reaction zone followed by a second delay. During each time delay, a purge gas, such as argon, is introduced into the processing chamber to purge the reaction zone or otherwise remove any residual reactive compound or reaction byproducts from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

As used herein, "chemical vapor deposition" refers to a process in which a substrate surface is exposed to precursors and/or co-reagents simultaneous or substantially simultaneously. As used herein, "substantially simultaneously" refers to either co-flow or where there is overlap for a majority of exposures of the precursors.

Plasma enhanced chemical vapor deposition (PECVD) is widely used to deposit thin films due to cost efficiency and film property versatility. In a PECVD process, for example, a hydrocarbon source, such as a gas-phase hydrocarbon or a vapor of a liquid-phase hydrocarbon that have been entrained in a carrier gas, is introduced into a PECVD chamber. A plasma-initiated gas, typically helium, is also introduced into the chamber. Plasma is then initiated in the chamber to create excited CH-radicals. The excited CH-radicals are chemically bound to the surface of a substrate positioned in the chamber, forming the desired film thereon. Embodiments described herein in reference to a PECVD process can be carried out using any suitable thin film deposition system. Any apparatus description described herein is illustrative and should not be construed or interpreted as limiting the scope of the embodiments described herein.

In one or more embodiments, the individual alternating layers may be formed to any suitable thickness. In one or more embodiments, the thickness of each layer of nitride material 106 is approximately equal. In one or more embodiments, the thickness of each layer of oxide material 104 is approximately equal. In one or more embodiments, the thickness of each silicon layer 104 is approximately equal. As used in this regard, thicknesses which are approximately equal are within +/−5% of each other.

In one or more embodiments, the average thickness of the layers of nitride material 106 is approximately equal to the average thickness of the layers of oxide material 104. In one or more embodiments, the average thickness of the layers of nitride material 106 is greater than or less than the average thickness of the layers of oxide material 104.

In one or more embodiments, the average thickness of the layer of nitride material 106 is in a range of about 10 nm to about 50 nm, including about 15 nm to about 40 nm, about 17 nm to about 35 nm, or about 20 nm to about 20 nm. In one or more embodiments, the average thickness of the layers of nitride material 106 is about 27 nm. In one or more embodiments, the average thickness of the layers of oxide material 104 is in a range of about 10 nm to about 50 nm, including about 15 nm to about 40 nm, about 17 nm to about 35 nm, or about 20 nm to about 20 nm. In one or more embodiments, the average thickness of the layers of oxide material 104 is about 25 nm. one or more embodiments, the average thickness of the silicon layer 104 is in a range of about 1 nm to about 10 nm, include about 2 nm, about 3 nm, about 4 nm, about 5 nm, about 6 nm, about 7 nm, about 8 nm, or about 9 nm. In one or more embodiments, the average thickness of a silicon layer 104 is about 3 nm.

Figure 3:
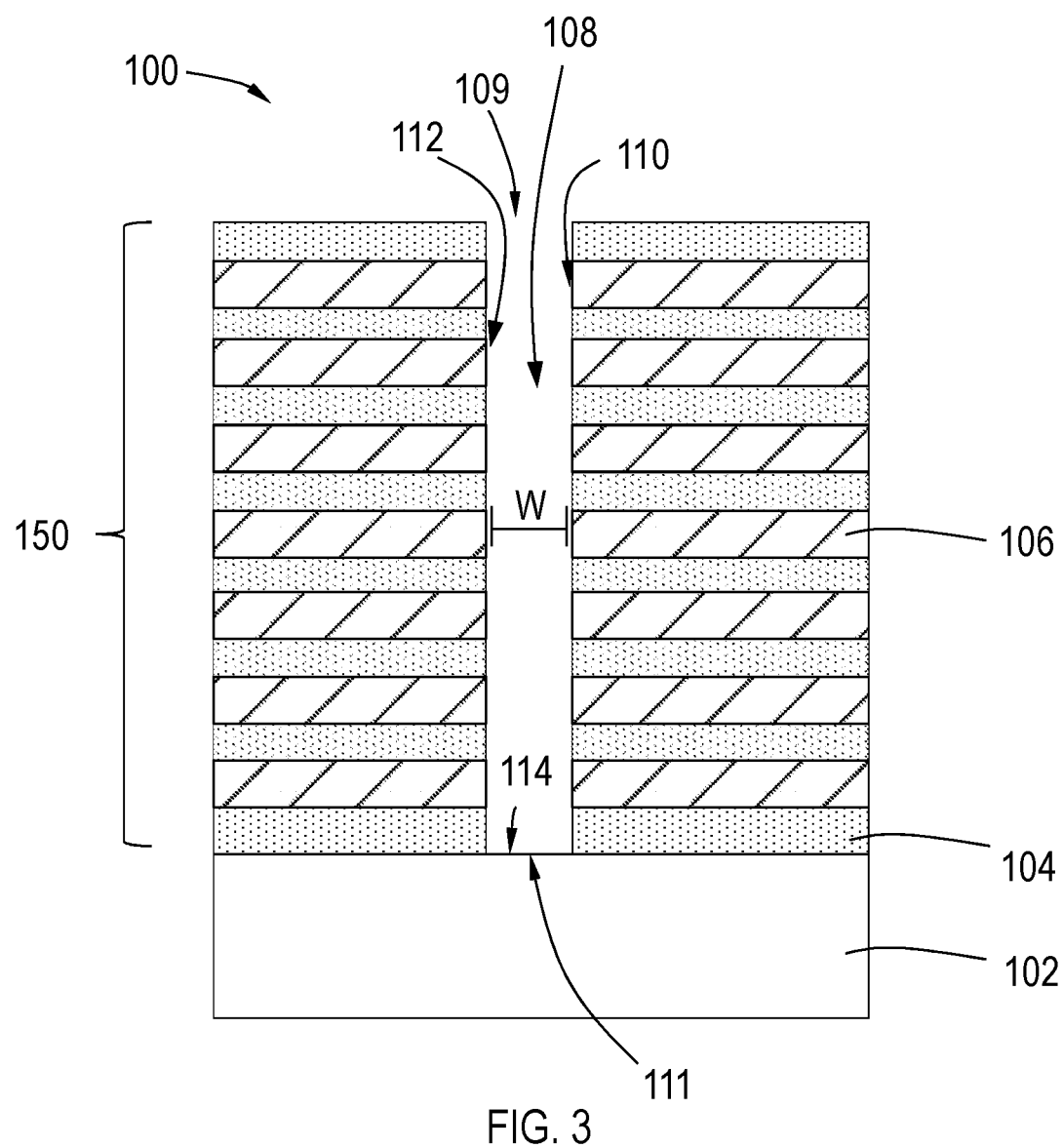
FIG. 3 illustrates a cross-sectional view of a memory device according to one or more embodiments described herein.

With reference to FIG. 3, after the alternating layers 150 are deposited, a memory hole 108 is etched through the alternating layers 150. Etching the memory hole 108 forms a first exposed surface 110, a second exposed surface 112, and a third exposed surface 114 of the alternating layers 150. The memory hole 108 has a width W. In one or more embodiments, the width W is approximately equal at the top 109 and bottom 111 of the memory hole 108.

Figure 4:
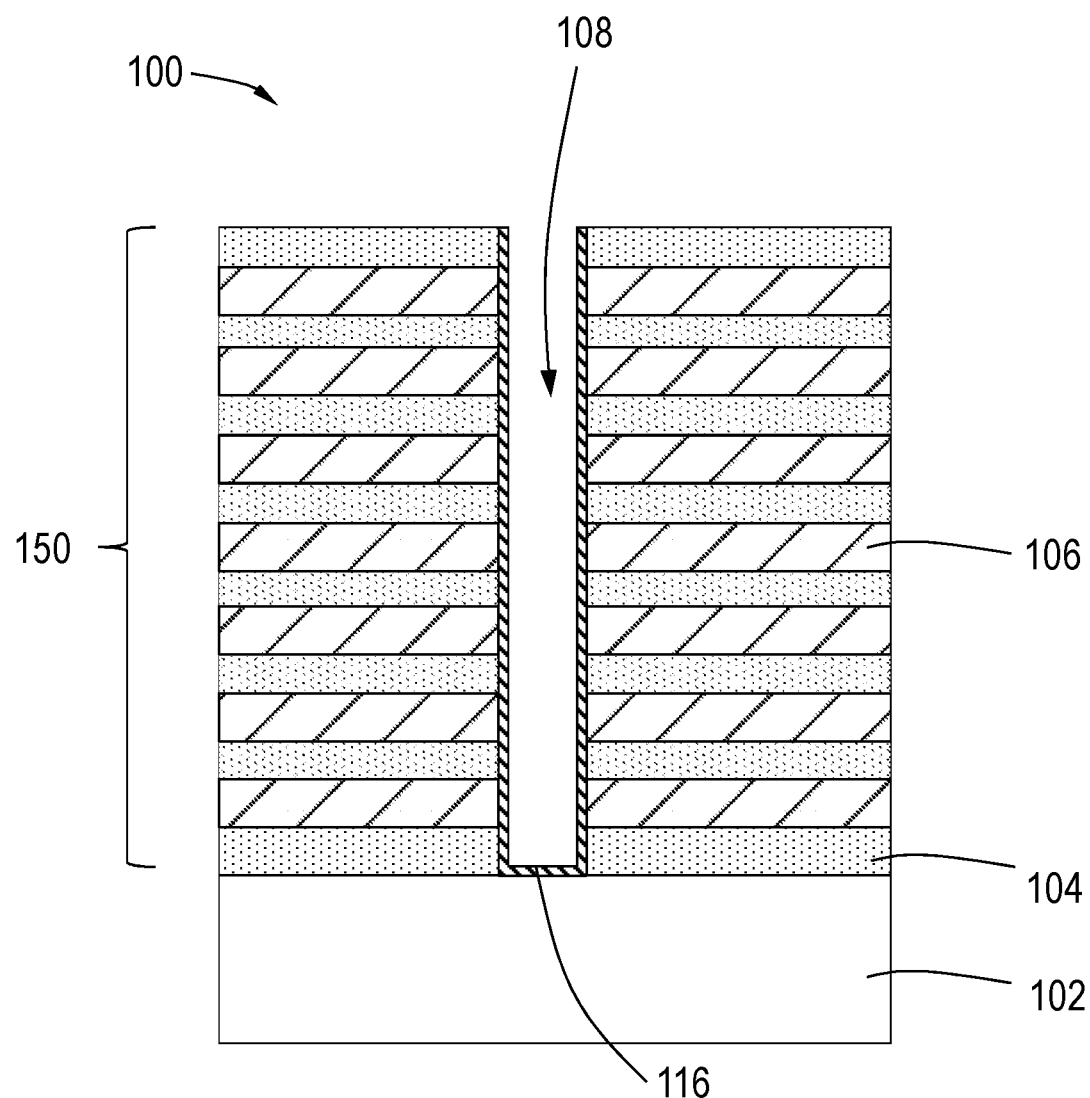
FIG. 4 illustrates a cross-sectional view of a memory device according to one or more embodiments described herein.

As shown in FIG. 4, in one or more embodiments, after etching the memory hole 108, a layer of poly-silicon 116 is conformally deposited into the memory hole. As used herein, the term "conformally deposited" means that the poly-silicon forms a thin layer on the first exposed surface, the second exposed surface, and the third exposed surface of the memory hole, but does not fill the memory hole.

Figure 5:
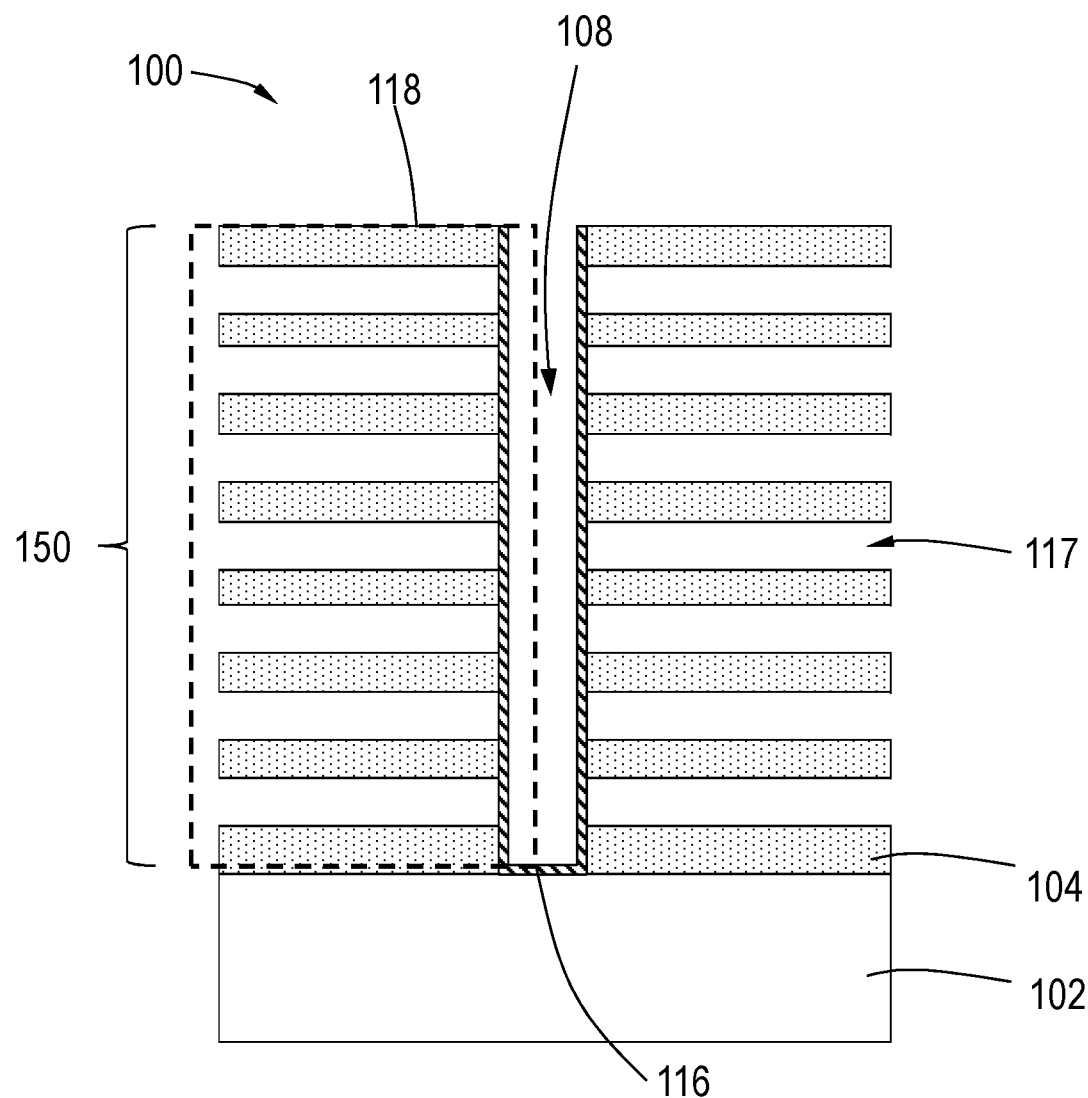
FIG. 5 illustrates a cross-sectional view of a memory device according to one or more embodiments described herein.

As shown in FIG. 5, in one or more embodiments, while not illustrated in the figures, after depositing the poly-silicon, a slit is opened on the opposite side of the alternating layers 150 from the memory hole 108. In one or more embodiments, the slit is formed using a hardmask. In one or more embodiments, etching the slit is performed using a reactive ion etch process. In one or more embodiments, the slit is formed by a similar process to the process used to etch the memory hole 108.

As shown in FIG. 5, after forming the slit, the nitride material 106 is removed to expose the oxide material 104 to form an opening 117 on the opposite side of the memory hole 108. The nitride material 106 may be removed by any suitable process. In one or more embodiments, the removal process is selective to the nitride material 106 over the oxide material 104.

The nitride material 106 can be removed by any suitable technique known to the skilled artisan including, but not limited to, selective etching. Etching the nitride material 106 laterally removes the nitride material 106 to form opening 117.

In one or more embodiments, the amount of nitride material 106 removed may be controlled. In one or more embodiments, the nitride material 106 is selectively etched to remove a predetermined depth D of nitride material 106.

As shown in FIG. 5, in one or more embodiments, the depth D of material removed from each layer of nitride material 106 is approximately equal.

In one or more embodiments, the nitride material 106 may be selectively etched by any suitable process selective to the oxide material 104 and the silicon layer 104. In one or more embodiments, the nitride material may be selectively etched by an atomic layer etching process.

In one or more embodiments, the nitride material 106 is selectively etched to remove a depth D that is proportional to the width W of the memory hole 108. In one or more embodiments, the depth D is greater than or equal to about 2% of W, greater than or equal to about 5% of W, greater than or equal to about 10% of W, or greater than or equal to about 15% of W. In one or more embodiments, the depth D is less than or equal to about 30% of W, less than or equal to about 25% of W, less than or equal to about 20% of W, less than or equal to about 15% of W, or less than or equal to about 10% of W. In one or more embodiments, the depth D is in a range of about 2% to about 30% of W, in a range of about 5% to about 25% of W, or in a range of about 10% to about 20% of W.

In one or more embodiments, the nitride material 106 is selectively etched to remove a predetermined depth D. In one or more embodiments, the depth D is less than or equal to about 500 nm, including about 450 nm, about 400 nm, about 350 nm, about 300 nm, about 250 nm, about 200 nm. In one or more embodiments, the depth D is about 100 nm to about 500 nm.

In one or more embodiments, the nitride material 106 is selectively etched to remove all of the nitride material 106.

Figure 6A:
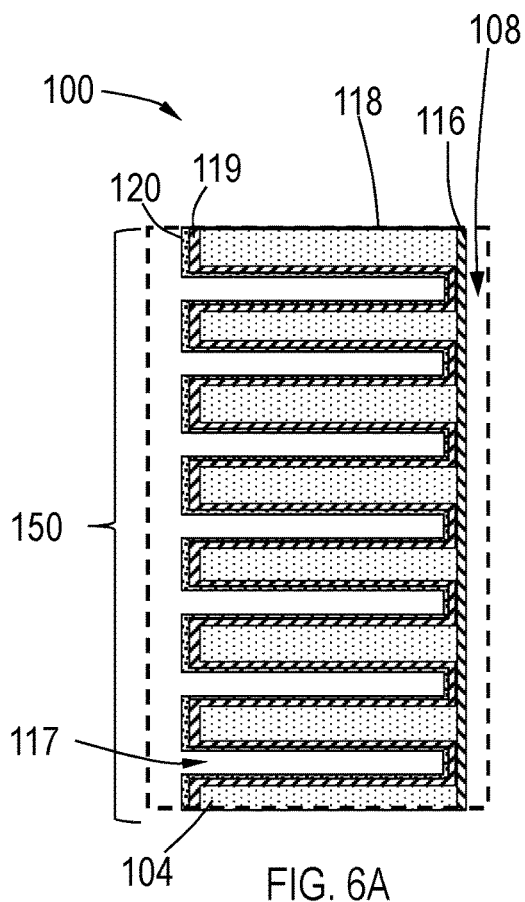
FIG. 6A illustrates an enlarged cross-sectional view of the memory device according to one or more embodiments described herein.
Figure 6B:
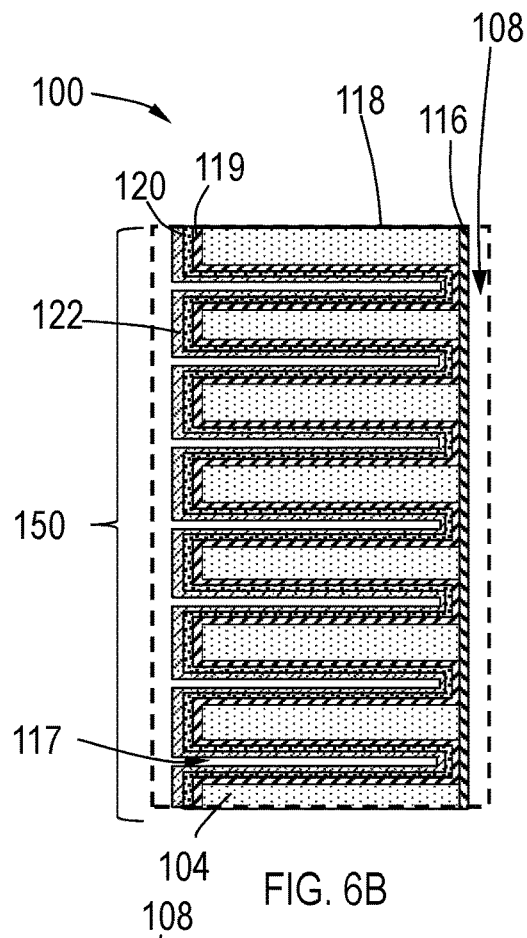
FIG. 6B illustrates an enlarged cross-sectional view of the memory device according to one or more embodiments described herein.
Figure 6C:
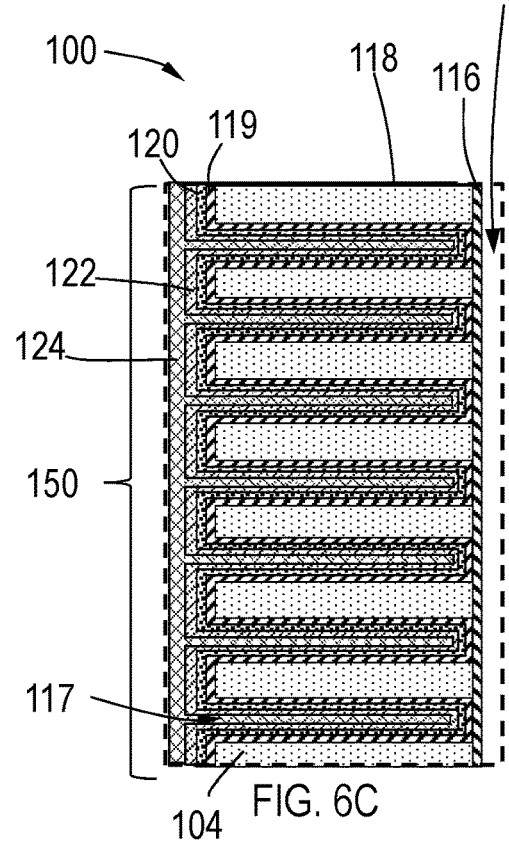
FIG. 6C illustrates an enlarged cross-sectional view of the memory device according to one or more embodiments described herein.

FIGS. 6A-6C show enlarged views of region 118. Referring to FIG. 6A, in one or more embodiments, one or more of a conformal layer of high-K material 119, or a conformal layer of aluminum oxide (AlOx) (not illustrated) is deposited on the first oxide material 104, followed by deposition of a metal nitride material in the opening 117 to form a conformal barrier layer 120 on the exposed surface of the high-k material 119. In one or more embodiments, the metal nitride material has a formula of TiXN or TaXN, where Ti is titanium, Ta is tantalum, X is a metal, and N is a nitride. In one or more embodiments, X is selected from one or more of aluminum (Al), silicon (Si), tungsten (W), lanthanum (La), yttrium (Yt), strontium (Sr), or magnesium (Mg). In some embodiments, the metal nitride has the formula TaN (tantalum nitride). Thus, in one or more embodiments, the metal nitride materials is selected from one or more of titanium aluminum nitride (TiAlN), titanium silicon nitride (TiSiN), titanium tungsten nitride (TiWN), tantalum nitiride (TaN), tantalum silicon nitride (TaSiN), tantalum aluminum nitride (TaAlN), tantalum tungsten nitride (TaWN), tantalum nitride (TaN), titanium lanthanum nitride (TiLaN), titanium yttrium nitride (TiYN), titanium strontium nitride (TiSrN), or titanium magnesium nitride (TiMgN).

In one or more embodiments, X is present in the barrier layer in an amount of about 5% to about 50%, including about 5%, about 10%, about 20%, about 25%, about 30%, about 35%, about 40%, about 45%, and about 50%, atomic percentage. In one or more embodiments, X is present in the barrier layer in an amount of about 5 to about 50%, including about 5%, about 10%, about 20%, about 25%, about 30%, about 35%, about 40%, about 45%, and about 50%, atomic percentage.

In one or more embodiments, the barrier layer 120 is deposited by atomic layer deposition. In one or more embodiments, the atomic layer deposition process is a spatial atomic layer deposition process. In one or more embodiments, the conformal barrier layer 120 is a liner. In one or more embodiments, the conformal barrier layer 120 is deposited at a temperature in a range of about 300° C. to about 700° C.

In one or more embodiments, the barrier layer 120 is substantially conformal to the exposed surface of the oxide material 104. As used herein, a layer which is "substantially conformal" refers to a layer where the thickness is about the same throughout (e.g., on the top, middle and bottom of sidewalls and on the bottom of the gap). A layer which is substantially conformal varies in thickness by less than or equal to about 5%, 2%, 1% or 0.5%. In one or more embodiments, the conformal barrier layer 120 has a thickness in a range of about 5 Å to about 50 Å, or about 6 Å to about 15 Å. In one or more embodiments, the conformal barrier layer 120 has a thickness of about 5 Å, or about 10 Å, or about 15 Å, or about 20 Å, or about 25 Å, or about 30 Å, or about 35 Å, or about 40 Å, or about 45 Å, or about 50 Å. In one or more embodiments, the barrier layer 120 has a thickness less than about 15 Å. In other embodiments, the barrier layer 120 has a thickness less than about 50 Å.

As shown in FIG. 6B, after depositing the conformal high-K layer 119 and the conformal barrier layer 120, an α-tungsten layer 122 is conformally deposited through opening 117 on the conformal barrier layer 120. In one or more embodiments, the α-tungsten layer 122 is formed by exposing a surface to a silicon precursor to form an amorphous silicon layer having a thickness; and forming a metal layer on the amorphous silicon layer, the metal layer comprising tungsten, the metal layer formed by sequentially exposing the amorphous silicon layer to a metal precursor and a reactant, the metal precursor comprising one or more of tungsten chloride ($WCl_x$), tungsten oxychloride ($WO_xCl_x$), tungsten fluoride ($WF_x$), and the like, and the reactant comprising hydrogen. In one or more embodiments, the silicon precursor comprises poly-silane. The poly-silane may be selected from one or more of disilane, trisilane, tetrasilane, isotetrasilane, neopentasilane, cyclopentasilane, hexasilane, or cyclohexasilane. In one or more embodiments, prior to forming the metal layer, the amorphous silicon layer is exposed to a degas environment to remove outgassed species. The degas environment may consist essentially of an inert gas including, but not limited to, one or more of argon, helium, or nitrogen.

In some embodiments, the amorphous silicon (a-Si) formation can be achieved by maximizing the partial pressure of the silicon precursor while minimizing the wafer temperature. Suitable silicon precursors include, but are not limited to, poly-silanes ($Si_xH$). For example, poly-silanes include disilane ($Si_2H_6$), trisilane ($Si_3H_8$), tetrasilane ($Si_4H_{10}$), isotetrasilane, neopentasilane ($Si_5H_{12}$), cyclopentasilane ($Si_5H$), hexasilane ($C_6H_{14}$), cyclohexasilane ($Si_6H_{12}$) or, in general, $S_xH_y$ with x=2 or more, and combinations thereof. For example, disilane, which has a moderate processing temperature and high vapor pressure, may be used as the silicon precursor alone or in combination with other species.

In some embodiments, the silicon precursor comprises substantially only disilane. As used in this specification and the appended claims, the phrase "substantially only disilane" means that at least 95% of the active species is disilane. Other gases, such as carrier gases and inert gases, can be included in any amount.

The thickness of the amorphous silicon layer can vary depending on, for example, the substrate surface and subsequent films and processes. In some embodiments, the amorphous silicon layer has a thickness in the range of about 1 Å to about 100 Å. In one or more embodiments, the amorphous silicon layer has a thickness in the range of about 1 Å to about 50 Å, or in the range of about 10 Å to about 40 Å, or in the range of about 30 Å to about 40 Å. In some embodiments, the thickness of the amorphous silicon layer is greater than 0 Å and less than or equal to about 50 Å, 45 Å or 40 Å.

A metal layer is formed on the amorphous silicon layer. The metal layer can be formed by any suitable technique including, but not limited to, atomic layer deposition (ALD), plasma-enhanced atomic layer deposition (PE-ALD), chemical vapor deposition (CVD), plasma-enhanced chemical vapor deposition (PE-CVD) and physical vapor deposition (PVD).

The metal layer can comprise any suitable metal. In some embodiments, the metal layer comprises one or more of tungsten or molybdenum. In some embodiments, the metal layer consists essentially of tungsten. In some embodiments, the metal layer consists essentially of molybdenum. As used in this regard, "consists essentially of" means that the metal layer is greater than or equal to about 80, 85, 90 or 95 atomic % of the specified component. For example, a metal layer consisting essentially of tungsten has a composition that is greater than or equal to about, for example, 90 atomic % tungsten.

In some embodiments, the metal layer is deposited by CVD. A metal precursor and a reactant may be coflowed into a processing chamber to deposit a layer on the substrate. The precursor and reactant are allowed to react in the gas phase.

In some embodiments, the metal layer is deposited by ALD. In a time-domain ALD process, the metal precursor is flowed into the processing chamber to react with the surface. The chamber is purged of excess precursor and byproducts and the reactant is flowed into the chamber. The precursor and reactant are not in the processing chamber at the same time so there is minimal or no gas phase reactions. In a spatial ALD process, the metal precursor is flowed into a first section of a processing chamber and the reactant is simultaneously flowed into a second section of the processing chamber. The first section and second section are separated by a gas curtain to prevent gas phase reactions between the precursor and reactant. The substrate is moved between the first section and the second section to sequentially expose the surface to the precursor and reactant. In some embodiments, the metal layer is deposited by sequentially exposing the amorphous silicon layer to a metal precursor and a reactant.

The metal precursor can be any suitable precursor that can be used to deposit a metal film. In some embodiments, the metal precursor comprises a metal selected from tungsten, molybdenum and combinations thereof. In one or more embodiments, the metal precursor comprises one or more of $WCl_6$, $WO_xCl_x$, $WF_x$, $MoCl_x$, $MoO_xCl_x$, $MoF_x$, and $MoCl_6$. In some embodiments, the metal precursor is a fluorine containing precursor. It is known that fluorine may etch silicon surface. Some embodiments of the disclosure advantageously allow the use of fluorine precursors because the amorphous silicon layer can be formed to a thickness sufficient to ensure that the precursor does not remove all of the a-Si film.

The reactant can be any suitable reactant that is able to react with a species formed on the surface. For example, if $WCl_6$ is used as the precursor, there will be —$WCl_x$ species on the surface. The reactant is able to react with the —$WCl_x$ species to produce an α-tungsten (W) film 122. In one or more embodiments, the α-tungsten film 122 has a thickness in a range of about 10 Å to about 80 Å, including about 10 Å, about 15 Å, about 20 Å, about 25 Å, about 30 Å, about 35 Å, about 40 Å, about 45 Å, about 50 Å, about 60 Å, about 65 Å, about 70 Å, about 75 Å, and about 80 Å. In one or more embodiments, the α-tungsten layer 122 is deposited at a temperature in a range of about 300° C. to about 500° C.

Referring to FIG. 6C, after conformal deposition of the α-tungsten film 122, a metal material 124 is deposited through opening 117 on the α-tungsten (W) film 122. In one or more embodiments, the metal material 124 fills the opening 117. In one or more embodiments, the metal material 124 comprises bulk tungsten (W).

In one or more embodiments, films of TiXN or TaXN, where X is a metal selected from, but not limited to, X is selected from one or more of aluminum (Al), silicon (Si), tungsten (W), lanthanum (La), yttrium (Y), strontium (Sr), or magnesium (Mg), have been compared to TiN for use as a nucleation and F barrier layer for bulk tungsten (W) growth in VNAND application. The TiXN or TaXN barrier layer/liners are deposited at about 450° C. to about 500° C., with thicknesses ranging from about 6 Å to about 15 Å. An α-tungsten (W) layer is then deposited at about 500° C., followed by deposition of bulk tungsten (W) at thicknesses of about 100 Å to about 300 Å at temperatures of about 400° C. to about 500° C. Without intending to be bound by theory, films of TiXN or TaXN cause at least a 15% reduction in stack resistivity compared to a liner comprising TiN. Films of TiSiN reduce the amount of F penetration from the bulk W to the substrate by 10 times compared to a liner of TiN. Additionally, the thinner barrier layer of TiXN or TaXN, when compared to the standard TiN or TaN liner, leads to greater tungsten (W) fill for VNAND memory structures, which can result in a reduction in overall resistivity for VNAND applications.

Figure 7:
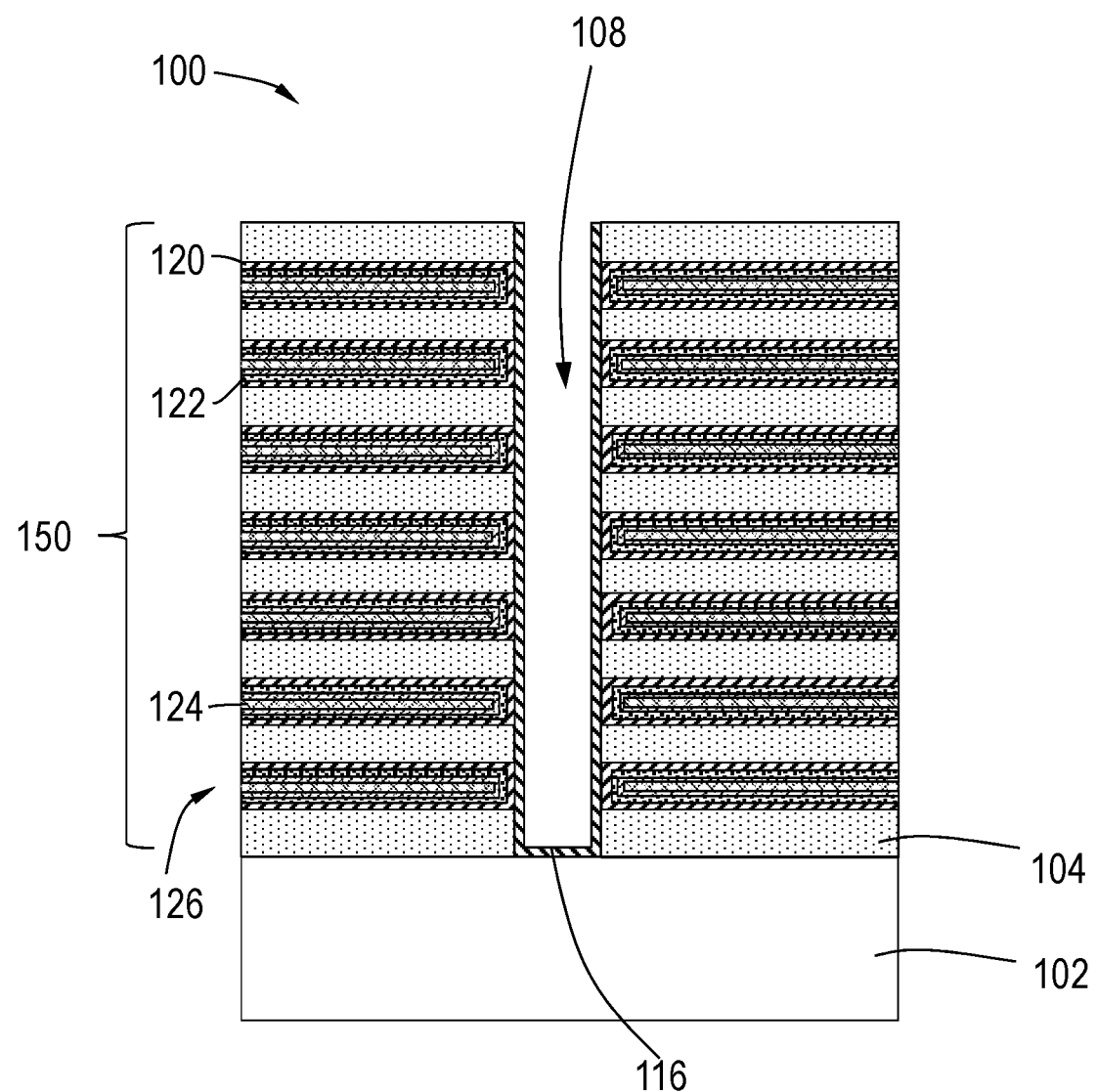
FIG. 7 illustrates a cross-sectional view of a memory device according to one or more embodiments described herein.

Referring to FIG. 7, as understood by one of skill in the art, any overburden created depositing the high-K layer 119, depositing the barrier layer 120, depositing the α-tungsten layer 122, and by filling the opening 117 with the metal material 124 may optionally then be removed to form a gate 126. The overburden of high-K layer 119, barrier layer material 120, α-tungsten layer 122, and metal material 124 may be removed by any technique known to one of skill in the art, including but not limited to, chemical mechanical planarization or etching.

With reference to FIG. 7, in one or more embodiments, a metal gate material 124 is deposited to fill the opening 117 between the layers of oxide material 104 and form a gate 126. The gate 126 may be any suitable conductive material known to the skilled artisan. In one or more embodiments, the gate material 124 comprises one or more of tungsten (W), copper (Cu), cobalt (Co), aluminum (Al), ruthenium (Ru), iridium (Ir), molybdenum (Mo), platinum (Pt), tantalum (Ta), titanium (Ti), or rhodium (Rh). In one or more embodiments, the gate material 124 comprises tungsten (W). In one or more embodiments, the gate material 124 is deposited by atomic layer deposition.

With reference to FIG. 7, one or more embodiments are directed to a memory structure comprising a plurality of alternating layers 150 of a silicon material 104 and a metal gate 126, the metal gate 126 comprising a conformal barrier layer 120, a conformal α-tungsten layer 122, and a bulk tungsten layer 124; and a memory hole channel 108 formed through the plurality of alternating layers 150 and having a conformal layer of a poly-silicon material 116 deposited on a first surface, a second surface, a third surface of the memory hole channel 108.

One or more embodiments are directed to a 3D NAND memory comprising a plurality of the NAND memory structures of one or more embodiments arranged in a three-dimensional configuration around the memory hole channel 108. In some embodiments, the 3D NAND memory cell comprises a bit line in the memory hole channel 108 contacting the poly-silicon material 116.

Figure 8:
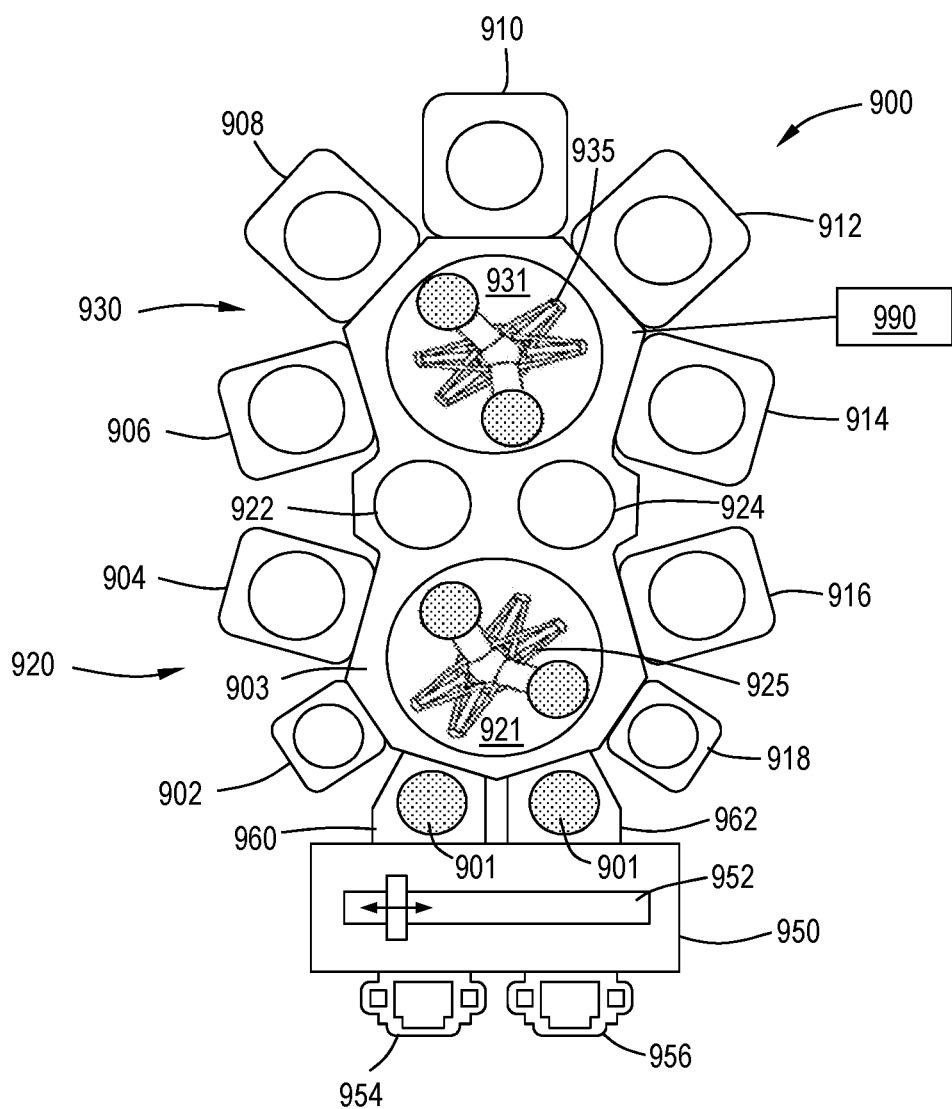
FIG. 8 illustrates a cluster tool according to one or more embodiments.

Additional embodiments of the disclosure are directed to processing tools 900 for the formation of the memory devices and methods described, as shown in FIG. 8. While the processing tool illustrated in FIG. 8 is a spatial ALD processing tool, one skilled in the art will recognize that the scope is not limited to spatial ALD tools.

The cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, a preclean chamber, a buffer chamber, transfer space(s), a wafer orienter/degas chamber, a cryo cooling chamber, a deposition chamber, annealing chamber, etching chamber and a blocking oxide material deposition chamber. The particular arrangement of process chambers and components can be varied depending on the cluster tool and should not be taken as limiting the scope of the disclosure.

In one or more embodiments, the cluster tool 900 includes a barrier layer deposition chamber, and an α-tungsten deposition chamber. The a barrier layer deposition chamber and the α-tungsten deposition chamber of some embodiments comprises one or more of an atomic layer deposition chamber, a plasma enhanced atomic layer deposition chamber, a chemical vapor deposition chamber, a plasma enhanced chemical vapor deposition chamber, a spatial atomic layer deposition chamber, or a physical deposition chamber. In one or more embodiments, the cluster tool 900 includes a pre-cleaning chamber connected to the central transfer station.

In the embodiment shown in FIG. 8, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In one or more embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930, or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit, memory, suitable circuits and storage.

Processes may generally be stored in the memory of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a memory structure, the method comprising:

depositing a plurality of alternating layers of a nitride material and an oxide material;

etching a memory hole through the plurality of alternating layers to form a first exposed surface and a second exposed surface of the alternating layers and a third exposed surface at a bottom of the memory hole, the memory hole having a width;

depositing a conformal layer of poly-silicon into the memory hole, the conformal layer of poly-silicon deposited directly on the first exposed surface, the second exposed surface, and the third exposed surface without filling the memory hole;

removing the nitride material to form an opening and expose the oxide material;

conformally depositing a high-K layer in the opening;

conformally depositing a barrier layer in the opening on the high-K layer, the barrier layer comprising TiXN or TaXN;

conformally depositing an α-tungsten (W) layer on the barrier layer;

depositing a metal material on the α-tungsten (W) layer; and optionally, planarizing the memory structure.

2. The method of claim 1, wherein the X is selected from one or more of aluminum (Al), silicon (Si), tungsten (W), lanthanum (La), yttrium (Yt), strontium (Sr), or magnesium (Mg).

3. The method of claim 1, wherein the metal nitride material is selected from one or more of titanium aluminum nitride (TiAlN), titanium silicon nitride (TiSiN), titanium tungsten nitride (TiWN), tantalum nitiride (TaN), tantalum silicon nitride (TaSiN), tantalum aluminum nitride (TaAlN), tantalum tungsten nitride (TaWN), tantalum nitride (TaN), titanium lanthanum nitride (TiLaN), titanium yttrium nitride (TiYN), titanium strontium nitride (TiSrN), or titanium magnesium nitride (TiMgN).

4. The method of claim 1, wherein the barrier layer has a thickness in a range of about 5 Å to about 50 Å.

5. The method of claim 2, wherein X is present in the barrier layer in an amount of about 5% to about 50%.

6. The method of claim 1, wherein the α-tungsten (W) layer has a thickness of in a range of about 5 Å to about 60 Å.

7. The method of claim 1, wherein the barrier layer is deposited by atomic layer deposition at a temperature in a range of about 300° C. to about 700° C.

8. The method of claim 1, wherein the α-tungsten (W) layer is deposited at a temperature in a range of about 300° C. to about 700° C.

* * * * *